(12) United States Patent
Chen et al.

(10) Patent No.: US 9,980,565 B2
(45) Date of Patent: May 29, 2018

(54) SLIDE RAIL ASSEMBLY AND RAIL KIT THEREOF

(71) Applicant: KING SLIDE WORKS CO., LTD., Kaohsiung (TW)

(72) Inventors: Ken-Ching Chen, Kaohsiung (TW); Shun-Ho Yang, Kaohsiung (TW); Chiang-Hsueh Fang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days. days.

(21) Appl. No.: 15/043,625

(22) Filed: Feb. 15, 2016

(65) Prior Publication Data

US 2017/0099946 A1 Apr. 13, 2017

(30) Foreign Application Priority Data

Oct. 13, 2015 (TW) .............................. 104133629 A

(51) Int. Cl.
*A47B 88/16* (2006.01)
*A47B 88/04* (2006.01)
*A47B 88/12* (2006.01)
*F16C 29/12* (2006.01)

(52) U.S. Cl.
CPC ............ *A47B 88/16* (2013.01); *A47B 88/044* (2013.01); *A47B 88/12* (2013.01); *F16C 29/123* (2013.01); *F16C 2314/72* (2013.01)

(58) Field of Classification Search
CPC .... A47B 2210/0016; A47B 2210/0018; A47B 2210/0064; A47B 2210/0067; A47B 88/44; A47B 88/443; A47B 88/473; A47B 88/477; A47B 88/483; A47B 88/49; A47B 88/50; A47B 88/53; A47B 88/57; A47B 88/12; A47B 88/16
See application file for complete search history.

(56) References Cited

U.S. PATENT DOCUMENTS

| | | | |
|---|---|---|---|
| 3,650,578 A | 3/1972 | Del Vecchio | |
| 6,375,290 B1 | 4/2002 | Lin | |
| 6,412,891 B1 | 7/2002 | Liang | |
| 6,585,337 B1 | 7/2003 | Chen | |
| 6,764,149 B2 | 7/2004 | Jurja | |
| 6,817,685 B2 * | 11/2004 | Lammens | A47B 88/493 312/333 |
| 6,851,774 B2 | 2/2005 | Chen | |
| 6,926,377 B2 * | 8/2005 | Lammens | A47B 88/49 312/333 |
| 6,945,619 B1 * | 9/2005 | Chen | A47B 88/487 312/334.44 |

(Continued)

*Primary Examiner* — Andrew M Roersma
(74) *Attorney, Agent, or Firm* — Winston Hsu

(57) ABSTRACT

A slide rail assembly includes a first rail, a second rail, an engagement element and an operating element. The first rail has a blocking feature. The second rail is movable relative to the first rail. The engagement element is arranged on the second rail. When the second rail is moved to a predetermined position relative to the first rail, the engagement element abuts against the blocking feature. The engagement element is configured to be moved away from the blocking feature of the first rail in response to operation of the operating element.

6 Claims, 7 Drawing Sheets

(56) References Cited

U.S. PATENT DOCUMENTS

| | | | |
|---|---|---|---|
| 8,585,164 B2* | 11/2013 | Chen | A47B 88/49 312/333 |
| 2008/0111457 A1 | 5/2008 | Ji | |
| 2008/0124009 A1 | 5/2008 | Peng | |
| 2008/0246378 A1 | 10/2008 | Chen | |
| 2011/0233355 A1 | 9/2011 | Peng | |
| 2013/0058596 A1 | 3/2013 | Chen | |

* cited by examiner

SLIDE RAIL ASSEMBLY AND RAIL KIT THEREOF

BACKGROUND OF THE INVENTION

1. Field of the Invention

The present invention relates to a slide rail assembly and a rail kit, and more particularly, to a slide rail assembly and a rail kit comprising at least one engagement element.

2. Description of the Prior Art

Generally, a slide rail assembly comprises a first rail and a second rail movable relative to the first rail. When the second rail is moved to a predetermined position relative to the first rail along a direction, a blocking structure arranged between the second rail and the first rail can be used to block the second rail from moving further relative to the first rail along the direction, such that the second rail stays at the predetermined position. As technology keeps improving, a related product not only can use a blocking mechanism to hold the second rail at the predetermined position relative to the first rail, but also can use an operating element to release the blocking mechanism, so as to allow the second rail to continue moving relative to the first rail along the direction. In related patents, such as US patent number U.S. Pat. No. 6,412,891 B1 discloses a slide rail assembly comprising an outer rail (20), an inner rail (30), a blocking element (50) and a locking element (70). Wherein, the locking element (70) is pivoted to the inner rail (30). When the inner rail (30) is located at a position relative to the outer rail (20), the inner rail (30) is not movable relative to the outer rail (20) due to the locking element (70) and the blocking element (50) blocking each other.

SUMMARY OF THE INVENTION

The present invention relates to a slide rail assembly. A second rail of the slide rail assembly is configured to be held at a predetermined position relative to a first rail by at least one engagement element. In addition, an operating element is configured to operate the at least one engagement element.

According to an embodiment of the present invention, a slide rail assembly comprises a first rail, a second rail, a first engagement element and an operating element. The first rail has a blocking feature. The second rail is movable relative to the first rail along a direction. The first engagement element is arranged on the second rail. The first engagement element comprises a first engagement part. The operating element is configured to operatively drive the first engagement element to move. When the second rail is moved to a predetermined position relative to the first rail, the first engagement part of the first engagement element is located at a side of the blocking feature of the first rail for preventing the second rail from moving relative to the first rail along the direction. Wherein, when the operating element is moved, the first engagement part of the first engagement element is driven to be no longer located at the side of the blocking feature of the first rail.

According to the above embodiment, the slide rail assembly further comprises a second engagement element arranged between the second rail and the first engagement element. The second engagement element comprises a second engagement part. When the second rail is moved to the predetermined position, the first engagement part of the first engagement element and the second engagement part of the second engagement element are respectively located at two sides of the blocking feature.

Preferably, the first engagement element further comprises a first elastic part, and the second engagement element further comprises a second elastic part. The second elastic part of the second engagement element is adjacent to the first elastic part of the first engagement element.

Preferably, the second elastic part of the second engagement element has two ribs. The first elastic part of the first engagement element is located between the two ribs when the first elastic part is deformed by an external force.

According to the above embodiment, the operating element is linearly movably connected to the second rail.

Preferably, one of the second rail and the operating element has at least one guiding part. The slide rail assembly further comprises at least one connection element passing through the at least one guiding part.

Preferably, the at least one guiding part is an elongated hole. The at least one connection element passes through part of the elongated hole.

Preferably, the slide rail assembly further comprises an elastic element arranged between the second rail and the operating element.

According to the above embodiment, the second rail has a first end part and a second end part opposite to the first end part. The operating element has a first part, a second part and a disengagement feature arranged on the second part. The first part is adjacent to the first end part of the second rail. The second part is adjacent to the second end part of the second rail. When the disengagement feature is operatively moved by the operating element to push the first engagement part of the first engagement element, the first engagement part of the first engagement element is moved away from the side of the blocking feature of the first rail.

Preferably, the first engagement part of the first engagement element comprises a first engaging section, a second engaging section and a first inclined guiding section connected between the first engaging section and the second engaging section. The disengagement feature of the operating element comprises a first disengaging section, a second disengaging section and a second inclined guiding section connected between the first disengaging section and the second disengaging section. When the first engagement part of the first engagement element abuts against the blocking feature, the second engaging section faces toward the second inclined guiding section and the second disengaging section faces toward the first inclined guiding section.

According to another embodiment of the present invention, a rail kit comprises a rail, an operating element, a first engagement element and a second engagement element. The operating element is linearly movably connected to the rail. The first engagement element is arranged on the rail. The first engagement element comprises a first elastic part and a first engagement part. The second engagement element is arranged on the rail. The second engagement element comprises a second elastic part and a second engagement part. Wherein, the first elastic part of the first engagement element is adjacent to the second elastic part of the second engagement element. The first engagement part of the first engagement element is held at a position by the first elastic part. Wherein, when the first engagement part of the first engagement element is moved away from the position in response to operation of the operating element, the second elastic part of the second engagement element is driven to move the second engagement part.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
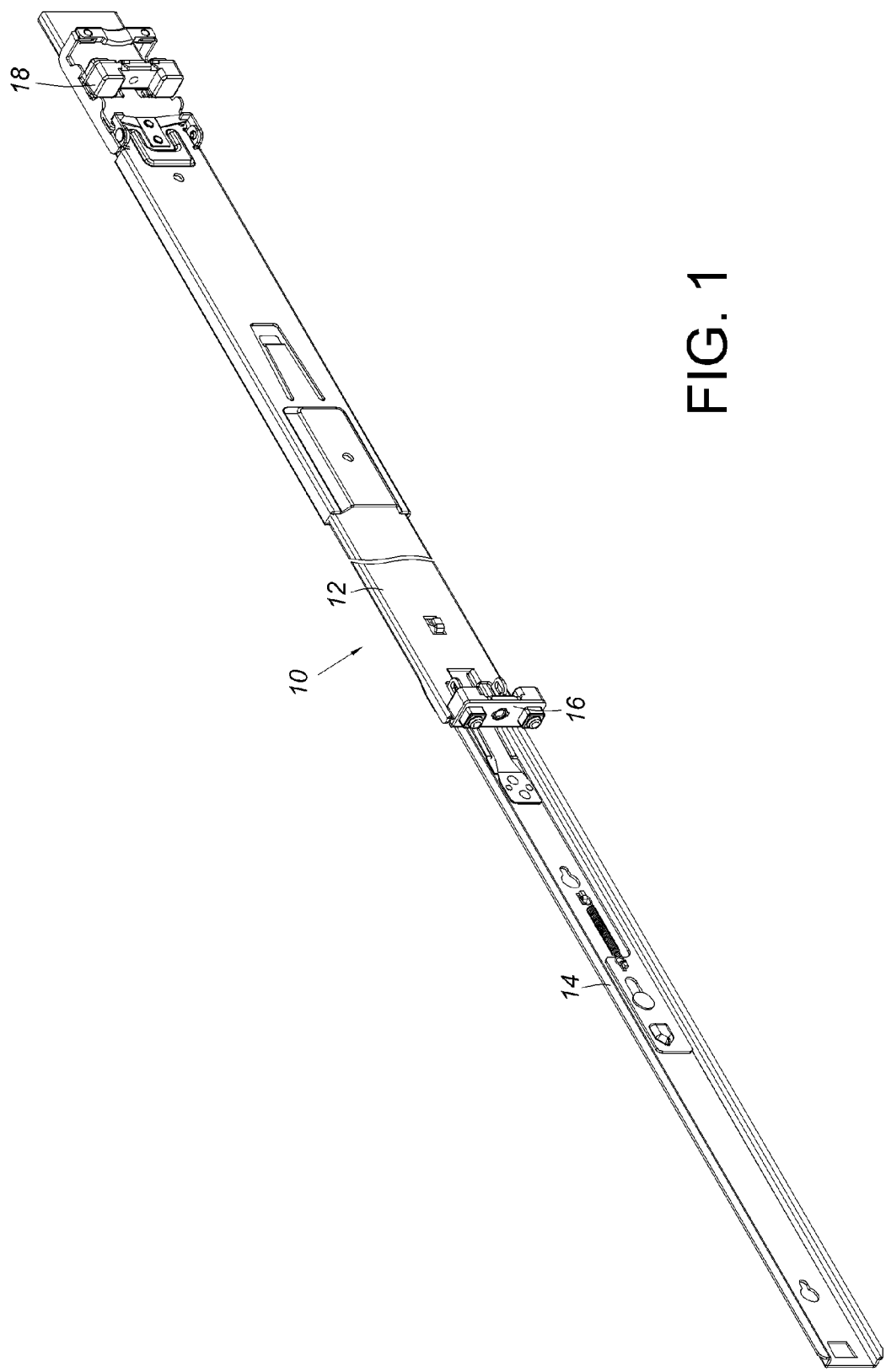
FIG. 1 is a diagram showing a slide rail assembly according to an embodiment of the present invention.

FIG. 1 is a diagram showing a slide rail assembly 10 according to an embodiment of the present invention. The slide rail assembly 10 comprises a first rail 12, and a second rail 14 movable relative to the first rail 12 from a retrieve state to an extension state. Preferably, a first bracket 16 and a second bracket 18 are arranged on the first rail 12 for respectively mounting the first rail 12 to a target object, such as a post, a wall, or a frame.

Figure 2:
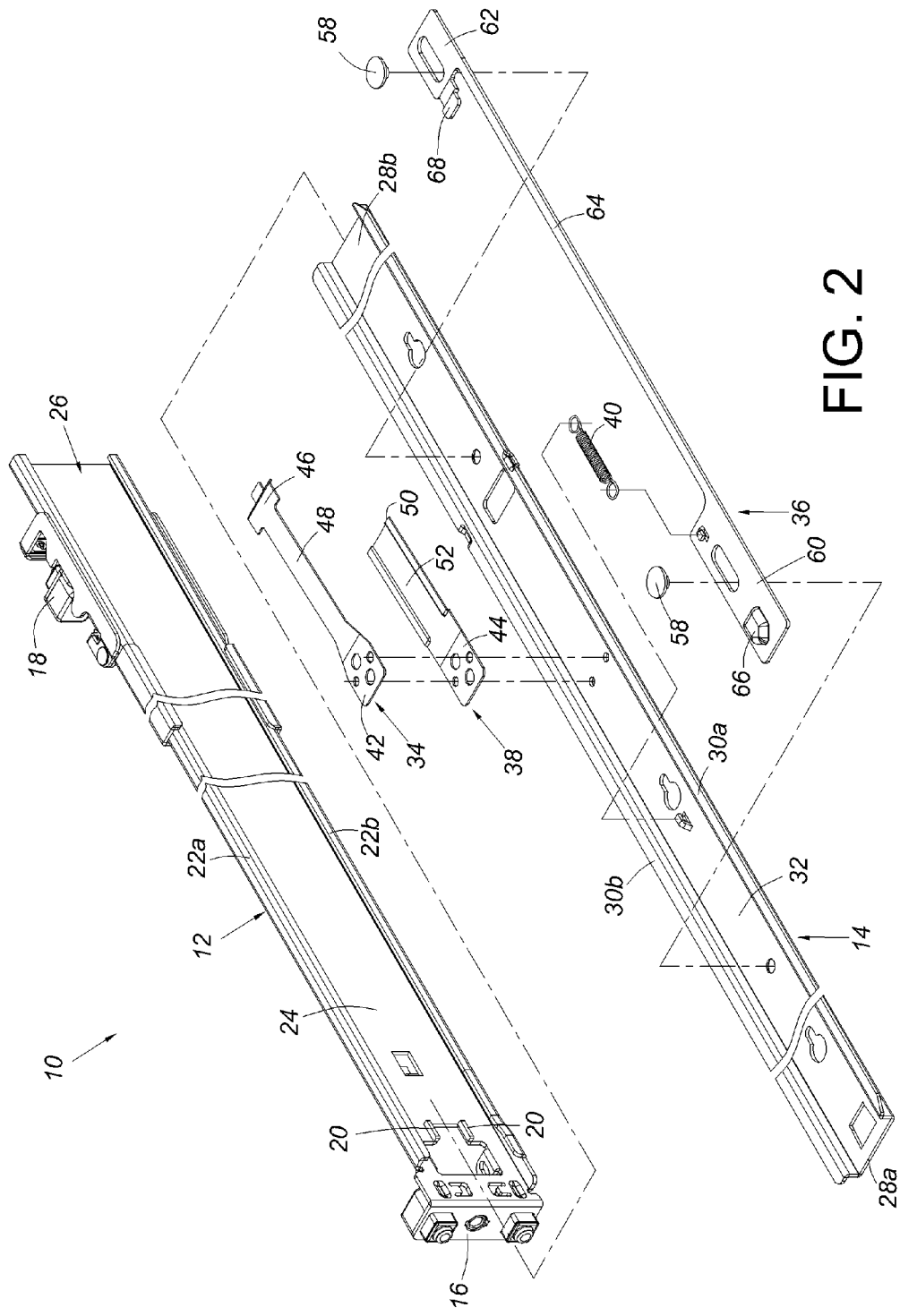
FIG. 2 is an exploded view of the slide rail assembly according to an embodiment of the present invention.

As shown in FIG. 2, the first bracket 16 and the second bracket 18 are respectively mounted on two parts (such as a front part and a rear part) of the first rail 12. The first rail 12 has at least one blocking feature 20. Specifically, the first rail 12 comprises a first wall 22a, a second wall 22b and a first longitudinal wall 24 connected between the first wall 22a and the second wall 22b. A passage 26 is defined by the first wall 22a, the second wall 22b and the first longitudinal wall 24. In the present embodiment, the at least one blocking feature 20 is located on the first longitudinal wall 24 and is a protrusion for example. At least a portion of the second rail 14 is arranged in the passage 26 of the first rail 12. The second rail 14 has a first end part 28a and a second end part 28b. The second end part 28b is opposite to the first end part 28a. The second rail 14 comprises a first wall 30a, a second wall 30b and a second longitudinal wall 32 connected between the first wall 30a and the second wall 30b. The slide rail assembly 10 further comprises a first engagement element 34, an operating element 36. Preferably, the slide rail assembly 10 further comprises a second engagement element 38 and an elastic element 40.

Figure 3:
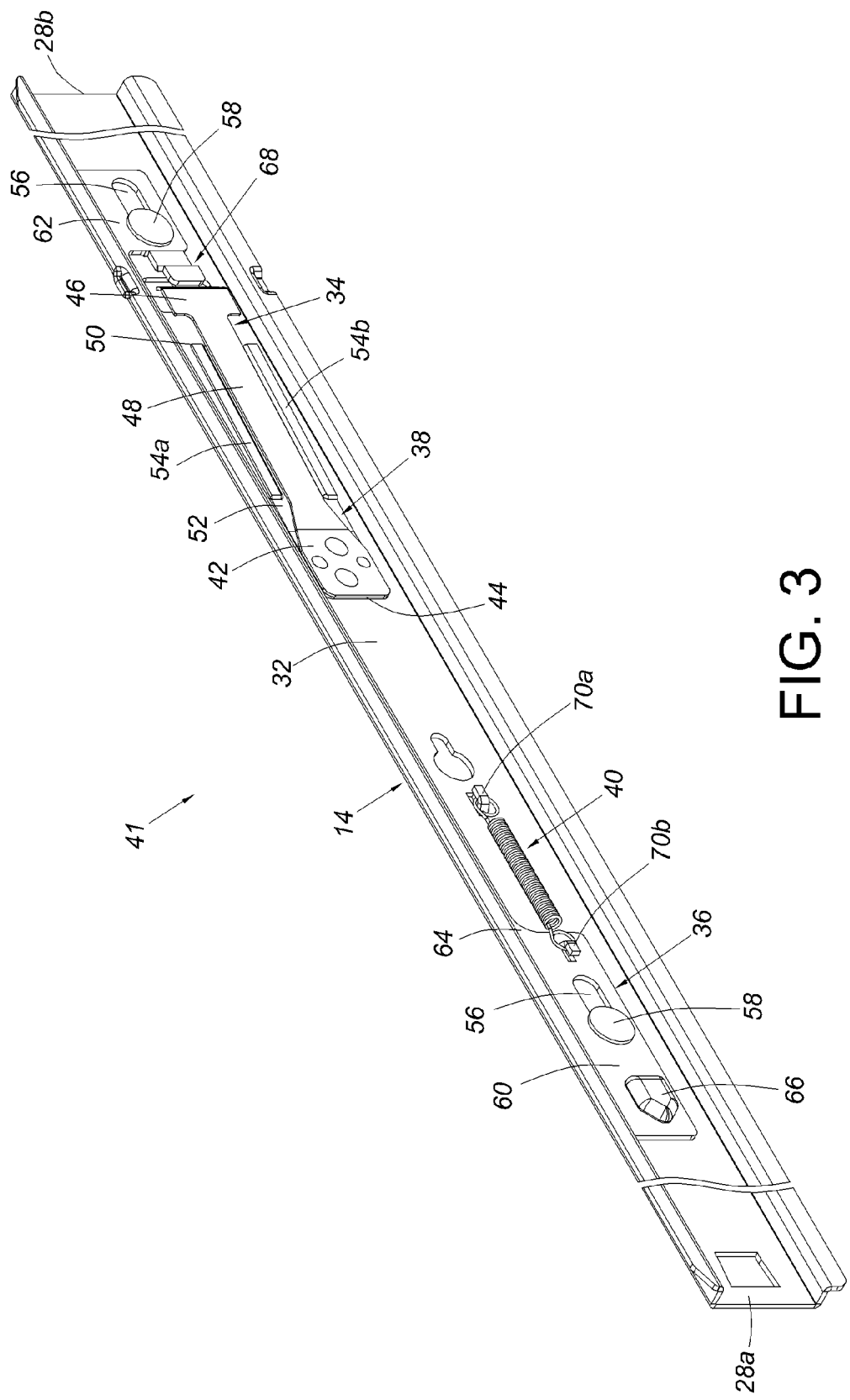
FIG. 3 is a diagram showing a rail kit according to an embodiment of the present invention.

As shown in FIG. 2 and FIG. 3, the second rail 14, the first engagement element 34, the second engagement element 38 and the operating element 36 form a rail kit 41. The first engagement element 34 and the second engagement element 38 are arranged on the second rail 14. Preferably, the second engagement element 38 is arranged between the second longitudinal wall 32 of the second rail 14 and the first engagement element 34. Wherein, the first engagement element 34 comprises a first base part 42, and the second engagement element 38 comprises a second base part 44. The first base part 42 and the second base part 44 can be connected to the second longitudinal wall 32 of the second rail 14 by screwing, riveting, welding, or bonding.

In particular, the first engagement element 34 further comprises a first engagement part 46 and a first elastic part 48 connected between the first base part 42 and the first engagement part 46. The first elastic part 48 is configured to provide an elastic force to the first engagement part 46. On the other hand, the second engagement element 38 further comprises a second engagement part 50 and a second elastic part 52 connected between the second base part 44 and the second engagement part 50. The second elastic part 52 is configured to provide an elastic force to the second engagement part 50. The second elastic part 52 of the second engagement element 38 is adjacent to the first elastic part 48 of the first engagement element 34. Preferably, the second elastic part 52 of the second engagement element 38 has two ribs 54a, 54b. The first elastic part 48 of the first engagement element 34 can be located between the two ribs 54a, 54b when the first elastic part 48 is deformed by an external force. In the present embodiment, the first elastic part 48 of the first engagement element 34 and the second elastic part 52 of the second engagement element 38 are obliquely tilted relative to the second longitudinal wall 32 of the second rail 14.

The operating element 36 is linearly movably connected to the second rail 14. Preferably, one of the second rail 14 and the operating element 36 has at least one guiding part 56. In the present embodiment, the operating element 36 has two guiding parts 56 for example. Each of the guiding parts 56 is an elongated hole. The slide rail assembly 10 further comprises two connection elements 58 respectively passing through the two guiding parts 56. For example, each of the connection elements 58 passes through part of the corresponding elongated hole and connects the operating element 36 to the second rail 14, such that the operating element 36 can be operatively moved relative to the second rail 14 within a limited range. The operating element 36 has a first part 60, a second part 62 and an extension part 64 connected between the first part 60 and the second part 62. Wherein, the first part 60 and the second part 62 are separated by a distance. The first part 60 is adjacent to the first end part 28a of the second rail 14, and the second part 62 is adjacent to the second end part 28b of the second rail 14. Preferably, the operating element 36 has an operating feature 66 (such as a bump arranged on the first part 60) and a disengagement feature 68 arranged on the second part 62.

The elastic element 40 is arranged between the second rail 14 and the operating element 36. For example, the second rail 14 and the operating element 36 respectively have a first mounting feature 70a and a second mounting feature 70b configured to mount the elastic element 40.

Figure 4:
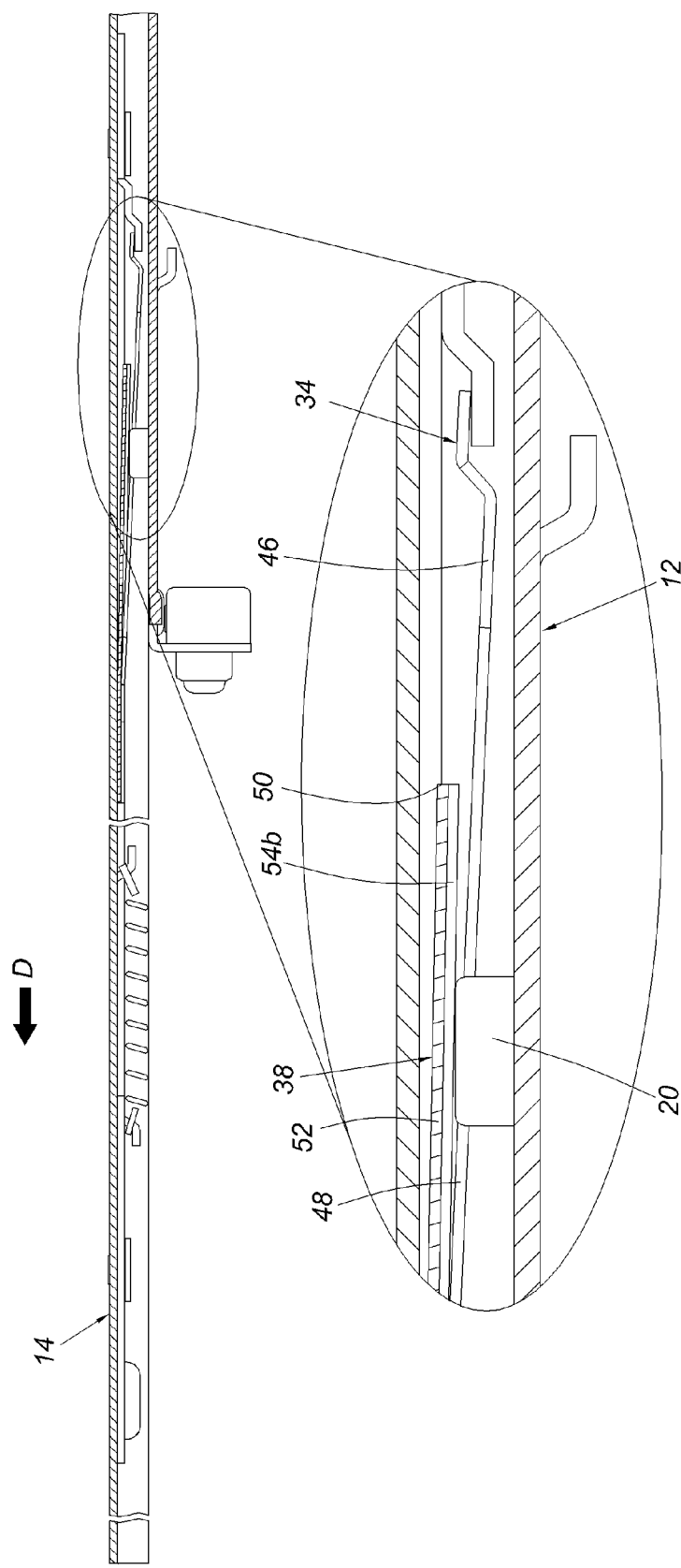
FIG. 4 is a diagram showing a second rail of the slide rail assembly moving relative to a first rail long a direction according to an embodiment of the present invention.

As shown in FIG. 4, when the second rail 14 is moved relative to the first rail 12 along a direction D, such as an expanding direction, the first elastic part 48 of the first engagement element 34 and the second elastic part 52 of the second engagement element 38 pass the blocking feature 20. Wherein, a portion of the second elastic part 52 abuts against the blocking feature 20 of the first rail 12 such that the second elastic part 52 can accumulate an elastic force in response to the movement of the second rail 14 relative to the first rail 12.

Figure 5:
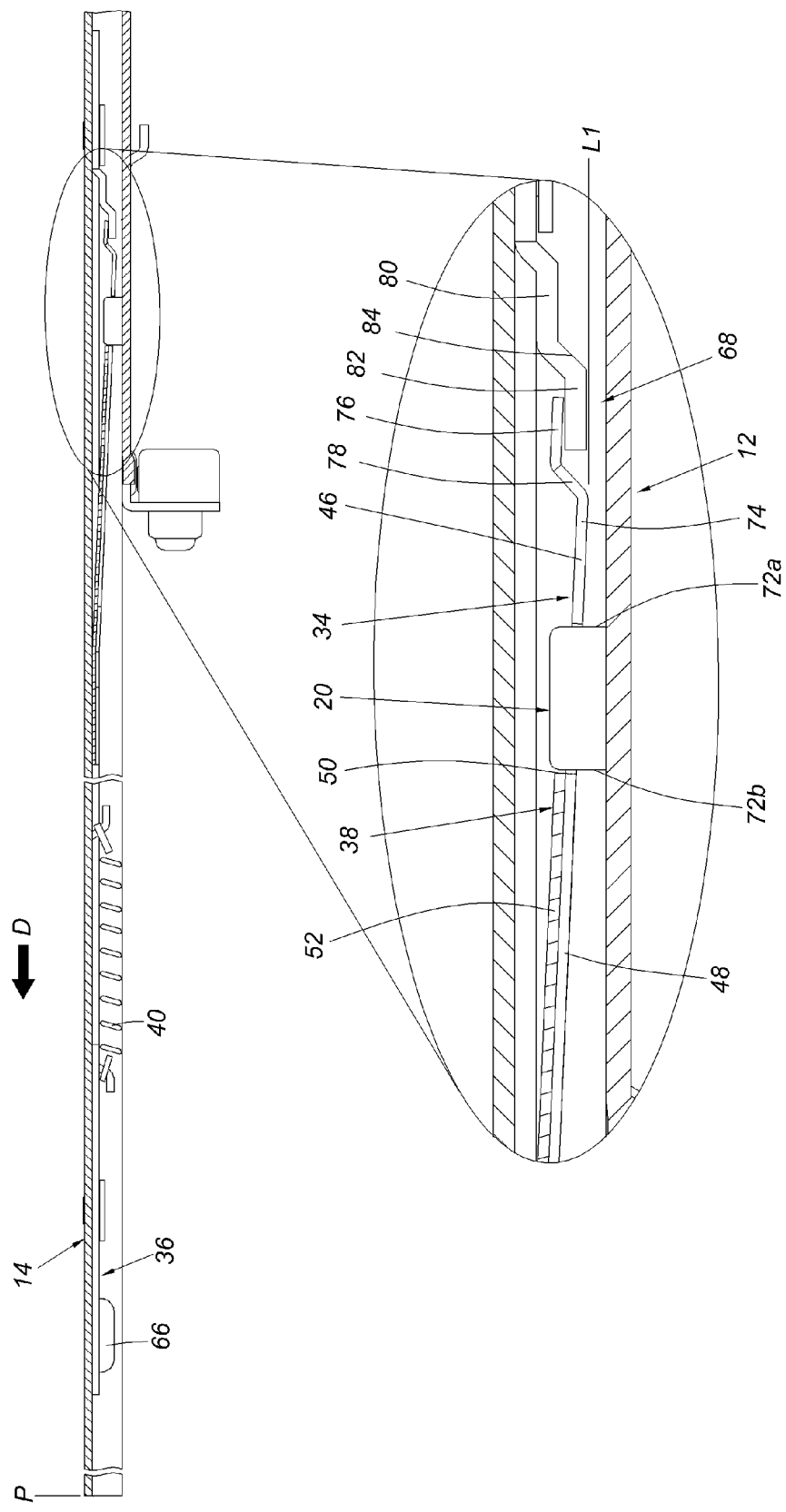
FIG. 5 is a diagram showing the second rail of the slide rail assembly in FIG. 4 moving to a predetermined position relative to the first rail.

As shown in FIG. 4 and FIG. 5, when the second rail 14 is moved to a predetermined position P relative to the first rail 12 along the direction D, the second elastic part 52 of the second engagement element 38 no longer abuts against the blocking feature 20 of the first rail 12. Thus the second elastic part 52 of the second engagement element 38 releases the elastic force, such that the second engagement part 50 of the second engagement element 38 is located at a side of the blocking feature 20, such as a second side 72b. The two ribs 54a, 54b of the second elastic part 52 of the second engagement element 38 can increase a blocking area with the blocking feature 20. Meanwhile, the first engagement part 46 of the first engagement element 34 is located at another side of the blocking feature 20, such as a first side 72a. Specifically, the first engagement part 46 of the first engagement element 34 can be held at a first position L1 by the first elastic part 48. That is to say, when the second rail 14 is located at the predetermined position P, the first engagement part 46 of the first engagement element 34 is located at the first side 72a of the blocking feature 20 of the first rail 12, such that the second rail 14 is blocked from moving further relative to the first rail 12 along the direction D. On the other hand, the second engagement part 50 of the second engagement element 38 is located at the second side 72b of the blocking feature 20, such that the second rail 14 is blocked from moving relative to the first rail 12 along a direction (such as a retrieve direction) opposite to the direction D. Therefore, under such condition, the second rail 14 is prevented from moving away from the predetermined position P relative to the first rail 12. Wherein, the second elastic part 52 of the second engagement element 38 can be further configured to support the first elastic part 48 of the first engagement element 34.

Figure 6:
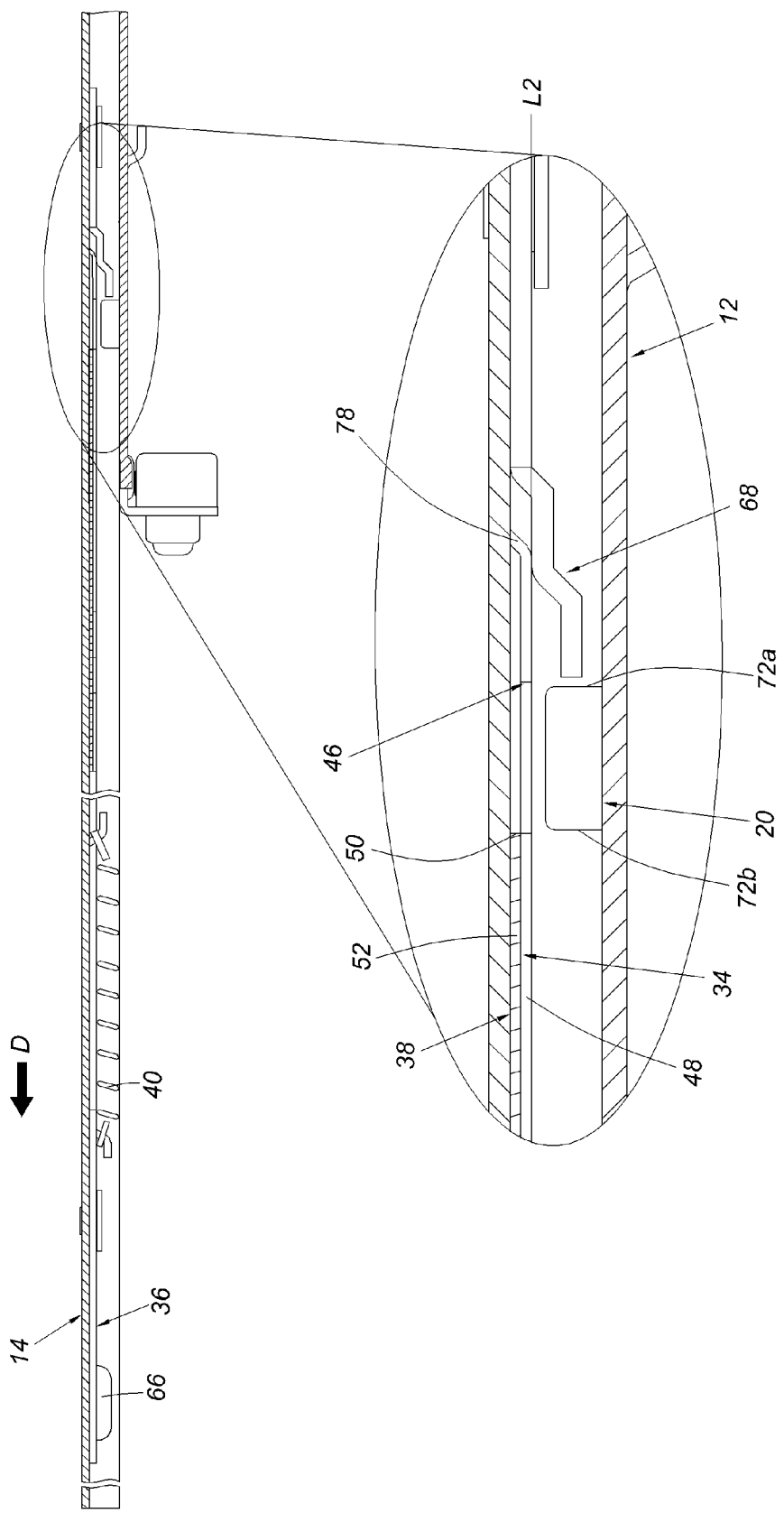
FIG. 6 is a diagram showing a first engagement element and a second engagement element of the slide rail assembly being moved away from a blocking feature in response to operation of an operating element according to an embodiment of the present invention.

As shown in FIG. 5 and FIG. 6, the first engagement element 34 is operatively moved in response to operation of the operating element 36, and the first engagement element 34 is driven by the operating element 36 to move away from the blocking feature 20 of the first rail 12. Specifically, a user can apply a force to the operating feature 66 of the operating element 36 along the direction D for moving the operating element 36 along the direction D. As such, the disengagement feature 68 of the operating element 36 pushes the first engagement part 46 of the first engagement element 34, such that the first engagement part 46 is moved away from the first side 72a of the blocking feature 20 in response to the operation of the operating element 36. Moreover, the first elastic part 48 of the first engagement element 34 further drives the second elastic part 52 of the second engagement element 38, such that the second engagement part 50 of the second engagement element 38 is moved away from the second side 72b of the blocking feature 20. That is to say, the first engagement part 46 of the first engagement element 34 can move from the first position L1 to a second position L2 in response to the operation of the operating element 36, and further drive the second elastic part 52 of the second engagement element 38 to move the second engagement part 50 away from the blocking feature 20. In addition, when the operating element 36 is operatively moved along the direction D, the elastic element 40 is switched to a stretched state from an initial state.

Preferably, the first engagement part 46 of the first engagement element 34 comprises a first engaging section 74, a second engaging section 76 and a first inclined guiding section 78 connected between the first engaging section 74 and the second engaging section 76. On the other hand, the disengagement feature 68 of the operating element 36 comprises a first disengaging section 80, a second disengaging section 82 and a second inclined guiding section 84 connected between the first disengaging section 80 and the second disengaging section 82. When the first engaging section 74 of the first engagement part 46 of the first engagement element 34 abuts against the first side 72a of the blocking feature 20, the second engaging section 76 faces toward the second inclined guiding section 84, and the second disengaging section 82 faces toward the first inclined guiding section 78. Therefore, when the operating element 36 is moved along the direction D, the second disengaging section 82 of the disengagement feature 68 of the operating element 36 is guided by the first inclined guiding section 78 to push the first engagement part 46 of the first engagement element 34. On the other hand, the second engaging section 76 of the first engagement part 46 of the first engagement element 34 is guided by the second inclined guiding section 84, such that the first engagement part 46 of the first engagement element 34 is moved away from the first side 72a of the blocking feature 20.

Figure 7:
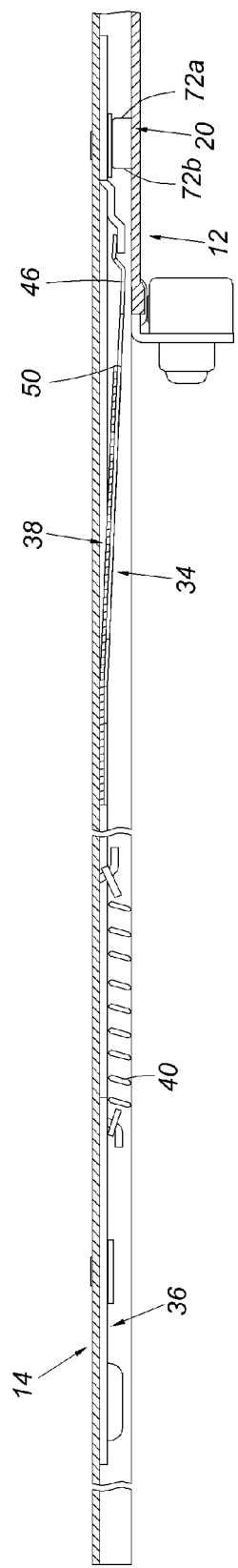
FIG. 7 is a diagram showing the second rail moving further relative to the first rail along the direction after the first engagement element and the second engagement element of the slide rail assembly are moved away from the blocking feature according to an embodiment of the present invention.

As shown in FIG. 6 and FIG. 7, when the first engagement part 46 of the first engagement element 34 and the second engagement part 50 of the second engagement element 38 are respectively moved away from the first side 72a and the second side 72b of the blocking feature 20, and the user stops applying the force to the operating element 36 along the direction D for allowing the elastic element 40 to return to the initial state, the user can operate the second rail 14 to continue moving relative to the first rail 12 along the direction D, such that the second rail 14 can be dismounted from the first rail 12 for replacement or related maintenance operation. On the other hand, in the state of FIG. 6, the user can also operate the second rail 14 to move relative to the first rail 12 along the direction opposite to the direction D.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A slide rail assembly, comprising:
a first rail having a blocking feature;
a second rail movable relative to the first rail along an expanding direction and a retrieve direction opposite to the expanding direction, the second rail having a longitudinal wall, a first end part and a second end part opposite to the first end part;
a first engagement element arranged on the second rail, the first engagement element comprising a first engagement part and a first elastic part;
a second engagement element arranged between the second rail and the first engagement element, the second engagement element comprising a second engagement part and a second elastic part, the second elastic part of the second engagement element is adjacent to the first elastic part of the first engagement element; and
an operating element linearly movably connected to the second rail, wherein the operating element has a first part, a second part and a disengagement feature arranged on the second part, the first part is adjacent to the first end part of the second rail, the second part is adjacent to the second end part of the second rail, and the operating element is separate and independent from the first engaging element and the second engaging element;
wherein when the second rail is moved to a predetermined position relative to the first rail, the first engagement part of the first engagement element is located at a first side of the blocking feature of the first rail for preventing the second rail from moving relative to the first rail along the expanding direction, and the second engagement part of the second engagement element is located at a second side of the blocking feature of the first rail for preventing the second rail from moving relative to the first rail along the retrieve direction;

wherein the first engagement part of the first engagement element comprises a first engaging section, a second engaging section and a first inclined guiding section connected between the first engaging section and the second engaging section, the disengagement feature of the operating element comprises a first disengaging section, a second disengaging section and a second inclined guiding section connected between the first disengaging section and the second disengaging section;

wherein when the disengagement feature of the second part of the operating element is operatively moved along the expanding direction by the first part of the operating element to push the first engagement part of the first engagement element toward the longitudinal wall of the second rail, the first engagement part of the first engagement element is moved away from the first side of the blocking feature of the first rail, and the first elastic part of the first engagement element further drives the second elastic part of the second engagement element to move the second engagement part toward the longitudinal wall of the second rail to be away from the second side of the blocking feature.

2. The slide rail assembly of claim 1, wherein the second elastic part of the second engagement element has two ribs, the first elastic part of the first engagement element is located between the two ribs when the first elastic part is deformed by an external force.

3. The slide rail assembly of claim 1, wherein one of the second rail and the operating element has at least one guiding part, the slide rail assembly further comprises at least one connection element passing through the at least one guiding part.

4. The slide rail assembly of claim 3, wherein the at least one guiding part is an elongated hole, the at least one connection element passes through part of the elongated hole.

5. The slide rail assembly of claim 3, further comprising an elastic element arranged between the second rail and the operating element.

6. The slide rail assembly of claim 1, wherein when the first engagement part of the first engagement element abuts against the blocking feature, the second engaging section faces toward the second inclined guiding section, and the second disengaging section faces toward the first inclined guiding section.

* * * * *

UNITED STATES PATENT AND TRADEMARK OFFICE
CERTIFICATE OF CORRECTION

PATENT NO. : 9,980,565 B2  
APPLICATION NO. : 15/043625  
DATED : May 29, 2018  
INVENTOR(S) : Ken-Ching Chen et al.

It is certified that error appears in the above-identified patent and that said Letters Patent is hereby corrected as shown below:

On the Title Page

Item (71), add the second applicant -- KING SLIDE TECHNOLOGY CO., LTD., Kaohsiung (TW) --.

Signed and Sealed this  
Thirty-first Day of July, 2018

Andrei Iancu  
*Director of the United States Patent and Trademark Office*